United States Patent
Madraswala et al.

(10) Patent No.: US 10,762,974 B2
(45) Date of Patent: *Sep. 1, 2020

(54) ONE CHECK FAIL BYTE (CFBYTE) SCHEME

(71) Applicant: Micron Technology, Inc., Boise, ID (US)

(72) Inventors: Aliasgar S. Madraswala, Folsom, CA (US); Kristopher H. Gaewsky, El Dorado Hills, CA (US); Naveen Vittal Prabhu, Folsom, CA (US); Purval S. Sule, Folsom, CA (US); Trupti Bemalkhedkar, Folsom, CA (US); Nehul N. Tailor, Phoenix, AZ (US); Quan H. Ngo, Elk Grove, CA (US); Dheeraj Srinivasan, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/430,086

(22) Filed: Jun. 3, 2019

(65) Prior Publication Data
US 2019/0355431 A1 Nov. 21, 2019

Related U.S. Application Data

(63) Continuation of application No. 15/717,554, filed on Sep. 27, 2017, now Pat. No. 10,354,738.

(51) Int. Cl.
*G11C 16/34* (2006.01)
*G11C 16/10* (2006.01)
(Continued)

(52) U.S. Cl.
CPC ...... *G11C 16/3459* (2013.01); *G11C 11/5628* (2013.01); *G11C 16/10* (2013.01);
(Continued)

(58) Field of Classification Search
None
See application file for complete search history.

(56) References Cited

U.S. PATENT DOCUMENTS 6,243,290 B1 6/2001 Kurata et al.
6,545,926 B2 4/2003 Ooishi et al.
(Continued)

FOREIGN PATENT DOCUMENTS

CN 105913879 8/2016
TW 201333952 8/2013
(Continued)

OTHER PUBLICATIONS

"International Application Serial No. PCT/US2018/051353, International Search Report dated Jan. 8, 2019", 4 pgs.
(Continued)

*Primary Examiner* — Tan T. Nguyen
(74) *Attorney, Agent, or Firm* — Schwegman Lundberg & Woessner, P.A.

(57) ABSTRACT

Various embodiments, disclosed herein, can include apparatus and methods to perform a one check failure byte (CFBYTE) scheme in programming of a memory device. In programming memory cells in which each memory cell can store multiple bits, the multiple bits being a n-tuple of bits of a set of n-tuples of bits with each n-tuple of the set associated with a level of a set of levels of threshold voltages for the memory cells. Verification of a program algorithm can be structured based on a programming algorithm that proceeds in a progressive manner by placing a threshold voltage of one level/distribution at a time. The routine of this progression can be used to perform just one failure byte check for that specific target distribution only, thus eliminating the need to check failure byte for all subsequent target
(Continued)

distribution during every stage of program algorithm. Additional apparatus, systems, and methods are disclosed.

20 Claims, 5 Drawing Sheets (51) Int. Cl.
*G11C 11/56* (2006.01)
*G11C 16/04* (2006.01)
(52) U.S. Cl.
CPC .......... *G11C 16/0458* (2013.01); *G11C 16/34* (2013.01); *G11C 2211/5621* (2013.01); *G11C 2211/5644* (2013.01); *G11C 2211/5648* (2013.01)

(56) References Cited

U.S. PATENT DOCUMENTS

| | | | |
|---|---|---|---|
| 8,050,101 B2 | 11/2011 | Park et al. | |
| 8,077,532 B2 | 12/2011 | Manabe et al. | |
| 8,891,311 B2* | 11/2014 | Joo | G11C 11/5628 365/185.03 |
| 9,019,780 B1* | 4/2015 | Lin | G11C 7/1006 365/189.05 |
| 9,042,184 B2 | 5/2015 | Ruby et al. | |
| 10,354,738 B2 | 7/2019 | Madraswala et al. | |
| 2008/0055998 A1 | 3/2008 | Jung et al. | |
| 2009/0016104 A1* | 1/2009 | Kim | G11C 11/5628 365/185.03 |
| 2009/0067254 A1 | 3/2009 | Won et al. | |
| 2009/0129153 A1 | 5/2009 | Sarin et al. | |
| 2009/0285021 A1* | 11/2009 | Lim | G11C 11/5628 365/185.03 |
| 2009/0310418 A1 | 12/2009 | Cernea | |
| 2010/0074025 A1 | 3/2010 | Park et al. | |
| 2010/0128524 A1* | 5/2010 | Hadas | G11C 11/5628 365/185.03 |
| 2011/0179322 A1 | 7/2011 | Lee et al. | |
| 2011/0194346 A1* | 8/2011 | Yoon | G11C 16/3454 365/185.03 |
| 2013/0016558 A1* | 1/2013 | Ahn | G11C 16/0483 365/185.03 |
| 2013/0039130 A1 | 2/2013 | Lee | |
| 2013/0336057 A1 | 12/2013 | Chung et al. | |
| 2014/0185385 A1 | 7/2014 | Kalavade et al. | |
| 2016/0180956 A1 | 6/2016 | Cho | |
| 2017/0162272 A1 | 6/2017 | Kavalipurapu et al. | |
| 2017/0169896 A1 | 6/2017 | Kavalipurapu et al. | |
| 2017/0186497 A1 | 6/2017 | Rajwade et al. | |
| 2019/0096494 A1 | 3/2019 | Madraswala et al. | |

FOREIGN PATENT DOCUMENTS

| | | |
|---|---|---|
| TW | 201438017 | 10/2014 |
| TW | 201921374 A | 6/2019 |
| WO | WO-2019067251 A1 | 4/2019 |

OTHER PUBLICATIONS

"International Application Serial No. PCT/US2018/05135, Written Opinion dated Jan. 8, 2019", 9 pgs.
"Taiwanese Application Serial No. 107134098, Office Action dated Jul. 26, 2019",w/ English Translation, 21 pgs.
U.S. Appl. No. 15/717,554 U.S. Pat. No. 10,354,738, filed Sep. 27, 2017, One Check Fail Byte (CFBYTE) Scheme.
"Taiwanese Application Serial No. 107134098, Response filed Oct. 29, 2019 to Office Action dated Jul. 26, 2019", w English Claims, 29 pgs.
"Taiwanese Application Serial No. 107134098, Office Action dated Dec. 3, 2019", W English Translation, 4 pgs.

* cited by examiner

ONE CHECK FAIL BYTE (CFBYTE) SCHEME

PRIORITY APPLICATION

This application is a continuation of U.S. application Ser. No. 15/717,554, filed Sep. 27, 2017, which is incorporated herein by reference in its entirety.

BACKGROUND

Memory devices are typically provided as internal, semiconductor, integrated circuits in computers or other electronic devices. There are many different types of memory, including volatile and non-volatile memory. Volatile memory requires power to maintain its data, and includes random-access memory (RAM), dynamic random access memory (DRAM), and synchronous dynamic random access memory (SDRAM), among others. Non-volatile memory can retain stored data when not powered, and includes flash memory, read-only memory (ROM), electrically erasable programmable ROM (EEPROM), erasable programmable ROM (EPROM), resistance variable memory, such as phase change random access memory (PCRAM), resistive random access memory (RRAM), and magnetoresistive random access memory (MRAM), among others.

Memory devices can typically include one or more groups of one-transistor, charge storage memory cells that allow for high memory densities, high reliability, and low power consumption. Two common types of flash memory array architectures include NAND and NOR architectures, named after the logic form in which the basic memory cell configuration of each is arranged. The charge storage memory cells can be arranged as a memory array, which is typically arranged in a matrix. The gates of each transistor based memory cell in a row of the memory array are coupled to an access line, for example, a word line in some structures. In a typical NOR architecture, the drains of each memory cell in a column of the array are coupled to a data line, for example, a bit line in some structures. In a typical NAND architecture, the drains of each memory cell in a column of the array are coupled together in series, source to drain, between a source line and a data line.

Both NOR and NAND architecture semiconductor memory arrays are accessed through decoders that activate specific memory cells by selecting the access line coupled to their gates. In a NOR architecture semiconductor memory array, once activated, the selected memory cells place their data values on data lines, causing different currents to flow depending on the state at which a particular cell is programmed. In a typical NAND architecture semiconductor memory array, a high bias voltage is applied to a drain-side select gate (SGD) line. A signal is applied to a source select gate (SGS) line to activate (turn on) select transistors to electrically couple strings to a source line. Access lines coupled to the gates of the unselected memory cells of each group are driven at a specified pass voltage (Vpass) to operate the unselected memory cells of each group as pass transistors, for example, to pass current in a manner that is unrestricted by their stored data values. Current then flows through each series coupled group, restricted only by the selected memory cells of each group, placing current encoded data values of the row of selected memory cells on the data lines.

Each charge storage memory cell in a NOR or NAND architecture semiconductor memory array can be programmed individually or collectively to one or a number of programmed states. For example, a single-level cell (SLC) can represent one of two programmed states, for example, a "1" or a "0", representing one bit of data. However, some memory cells can also represent one of more than two programmed states, allowing the manufacture of higher density memories without increasing the number of memory cells, as each cell can represent more than one binary digit, that is, more than one bit. Such cells can be referred to as multi-state memory cells, multi-digit cells, or multi-level cells (MLCs). In certain examples, MLC can refer to a memory cell that can store two bits of data per cell, which represents one of four programmed states, and a triple-level cell (TLC) can refer to a memory cell that can store three bits of data per cell, which represents one of eight programmed states. In other examples, MLC can refer to any memory cell that can store more than one bit of data per cell, or can represent one of more than two programmed states. Each one of these programmed states can be correlated to a threshold voltage ($V_t$) of the charge storage memory cell, defining a level for each of the programmed states. Each cell's $V_t$ is indicative of the data that is stored in the cell. These levels be also be referred to as a distribution, where the distribution has a number of different threshold levels at which to set the charge storage memory cell correlated to specific programmed states.

During a program algorithm in a NAND component, for example, a conventional program algorithm proceeds in a progressive manner by placing a $V_t$ of one level of multiple levels/distribution at a time. In such a design, multiple evaluations of failure bytes are performed at every program pulse/stage, to check the $V_t$ of the cells being programmed. This leads to inefficiency and increase in program performance, which can be represented by a time to program (tPROG).

DETAILED DESCRIPTION

The following detailed description refers to the accompanying drawings that show, by way of illustration, various embodiments of the invention. These embodiments are described in sufficient detail to enable those of ordinary skill in the art to practice these and other embodiments. Other embodiments may be utilized, and structural, logical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

In various embodiments, a unified one progressive check of failure bytes in an optimized manner for a programming operation of a memory device is provided. This approach thereby improves overall program performance of the memory device. The memory device, for example, can be a NAND memory device, though such a technique may be applicable to other memory devices. Verification of a program algorithm can be structured based on a programming algorithm that proceeds in a progressive manner by placing memory cells to $V_t$ of one level/distribution at a time. The routine of this progression can be used to perform just one failure byte check for that specific target distribution only, thus eliminating the need to check failure byte for all subsequent target distribution during every stage of program algorithm.

In an embodiment, a procedure can include performing a verify process as a single failure byte check for the one level only that is being programmed, for each level except a last level. A failure byte check for all levels can be performed in response to programming at the last level. This procedure provides a method that eliminates all but one fail byte check of all levels. Reduction of tPROG can be conducted in a rudimentary fashion of adjusting the tolerance level for fail bytes and by reducing other sections of program operation. This procedure can reduce the tPROG, since checking fail bytes at every stage in a program pulse stage adds logic overhead of approximately 10 μs to 15 μs. This procedure can apply to all programming types of distributions including, but not limited to, a two distribution (1 bit), a four distribution (2 bits), an eight distribution (three bits), a sixteen distribution (four bits), and other distributions. Such a procedure can also simplify the usage model of checking failure bytes and help manage tolerance for each stage separately.

A n-bit memory cell is a memory cell that can store n bits of data representing $2^n$ states, where each state can be represent by an n-tuple, which assigns a set of $2^n$ n-tuples as possible states for the n-bit memory cell. An n-tuple is an ordered group of n elements. For example, a 1-bit memory cell has $2^1$ states (0) and (1), which is a set of 2 n-tuples. A 2-bit memory cell has $2^2$ states (0, 0), (0, 1), (1, 0), and (1, 1), which is a set of $2^2$ n-tuples. A 3-bit memory cell has $2^3$ states (0, 0, 0), (0, 0, 1), (0, 1, 0), (0, 1, 1), (1, 0, 0), (1, 0, 1), (1, 1, 0), and (1, 1, 1), which is a set of $2^3$ n-tuples. A 4-bit memory cell has $2^4$ states (0, 0, 0, 0), (0, 0, 0, 1), (0, 0, 1, 0), (0, 0, 1, 1), (0, 1, 0, 0), (0, 1, 0, 1), (0, 1, 1, 0), (0, 1, 1, 1), (1, 0, 0, 0), (1, 0, 0, 1), (1, 0, 1, 0), (1, 0, 1, 1), (1, 1, 0, 0), (1, 1, 0, 1), (1, 1, 1, 0), and (1, 1, 1, 1), which is a set of $2^4$ n-tuples. Similar sets occur for n greater than four. In a n-bit memory cell, there are $2^n$ states that form a set of $2^n$ n-tuples, where correlated to each state is a value of a $V_t$ that is different from the values of a $V_t$ correlated to the other states of the set of $2^n$. For the n-bit memory cell, these $V_t$ form a set of threshold values, which is a set of $2^n$ values. To set a n-bit memory cell to a particular state, the charge storage device of the given n-bit memory cell is set to store a charge that sets the $V_t$ of the charge storage device to the value that is correlated to the particular state. The set of $V_t$s can be a set of discrete values or a range of values in which the ranges of $V_t$s are separated by an amount sufficient to reduce the possibility of a higher voltage $V_t$ of one range overlapping a lower $V_t$ of the next higher range.

Figure 1:
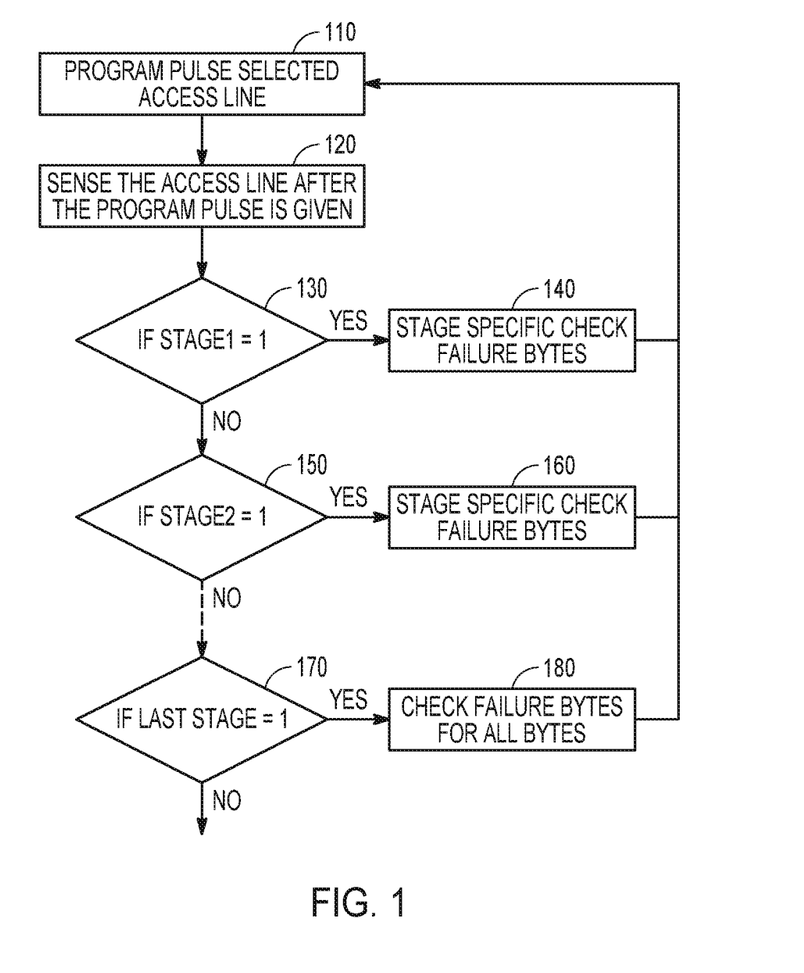
FIG. 1 is a flow diagram of features of an example method of checking failure bytes associated with a program/write operation of a memory array, according to various embodiments.

FIG. 1 is a flow diagram of features of an embodiment of an example method 100 of checking failure bytes associated with a program/write operation of a memory array. Method 100 steps through stages that correspond to the levels of the set of threshold voltages for sets of n-bit memory cells of the memory array. A programming procedure can include a number of programming loops to program a set of cells. A program loop can include a combination of a program pulse followed by one or more verify pulses. The program pulse voltage may be stepped higher in every subsequent program loop to allow or assist cells that are slower to program to reach their respective target voltage levels. Cells reaching their respective target levels, determined during the verification pulses, can be inhibited in all subsequent program pulses. This operation may continue until all cells in the page reach their target threshold voltage. However, most memories allow a certain small fraction of cells remain in an un-programmed state with respect to a check fail byte (CFBYTE), which can also be referred to as a count fail byte. CFBYTE and its process provide a method to count or check the number of fail bytes for a particular level, such that a microcontroller inside a memory device component being programmed can track the progress of the program algorithm and determine eventually the pass/fail status of the program of the memory device. The memory device can be, for example, a NAND component. Determining whether a particular level has passed/failed, the CFBYTE criterion involves a counting process. As long as the total failing cells for a given level are below the CFBYTE criterion for the level, the failure to program these memory cells is allowed and they are further inhibited from further programming in all subsequent program pulses. Moreover, the memory controller may also stop issuing verify pulses for that level in all subsequent program loops.

At 110, a program pulse is applied to a selected access line. At 120, the selected access line is sensed after the program pulse is given. The access line can be sensed by placing a voltage on the gate of a charge storage device, coupled to the selected access line, with respect to an expected value of threshold voltage and a current can be read from a conductive line coupled to the charge storage device for each of a set of memory cells coupled to the selected access line.

At 130, a determination is made as to whether stage 1 equals 1. Stage 1 can correspond to the lowest value of threshold voltage for a program state. If the determination at 130 is yes, then the process is at stage 1 and all of the memory cells that were supposed to reach level one have not, and a stage specific check of failure bytes is made at 140 including returning in a loop to 110 to perform a program pulse. If the determination at 130 is no, stage 1 does not equal one and the process is beyond stage 1. At 150, a determination is made as to whether stage 2 equals 1. Stage 2 can correspond to the first value of the set of threshold voltage values greater than the lowest value of threshold voltage corresponding to a program state. If the determination at 150 is yes, then the process is at stage 2 and all of the memory cells that were supposed to reach level two have not, and a stage specific check of failure bytes is made at 160 including returning in a loop to 110 to perform a program pulse. If the determination at 150 is no, stage 2 does not equal one and the process is beyond stage 2.

Method 100 continues in the same manner of determining whether all cells that were supposed to reach a subsequent level have done so and if not performing a level specific check of failure bytes. At 170, a determination is made as to whether the last stage equals 1. The last stage can correspond to the highest value of the set of threshold voltage values corresponding to a program state. If the determination at 170 is yes, then the process is at the last stage all of the memory cells that were supposed to reach the last level have not, and a check of failure bytes for all bytes is made at 180 including returning in a loop to 110 to perform a program pulse. The check fail byte in the last stage includes the accumulation of fail bytes from previous stages. The process is complete if the loop count for the pulse and verify loop reaches the set maximum criterion or if the check fail byte passes in the last stage.

Method 100 or methods similar to method 100 provide a technique to check failure bytes with respect of programming that provides a mechanism to reduce operation time associated with the programming. Failure bytes specific to a particular level, corresponding to a particular threshold voltage, are checked or a full check of failure bytes is performed depending on the stage of the program algorithm. In such methods, if the program algorithm is not in a last stage and if all bytes in the current stage pass the check after the program pulse, then the program algorithm moves to the next stage. If the program algorithm is in the last stage, then all the bytes can be checked irrespective of programming stage to indicate a success status of the program algorithm. At any stage, if the check fails, then a program pulse can be again given and verification processed again until the stage passes, or if the loop, which includes program pulsing, reaches a limit. If a limit for the number of program pulses in a loop is reached, then a fail status for the program can be indicated and the algorithm exited.

Figure 2:
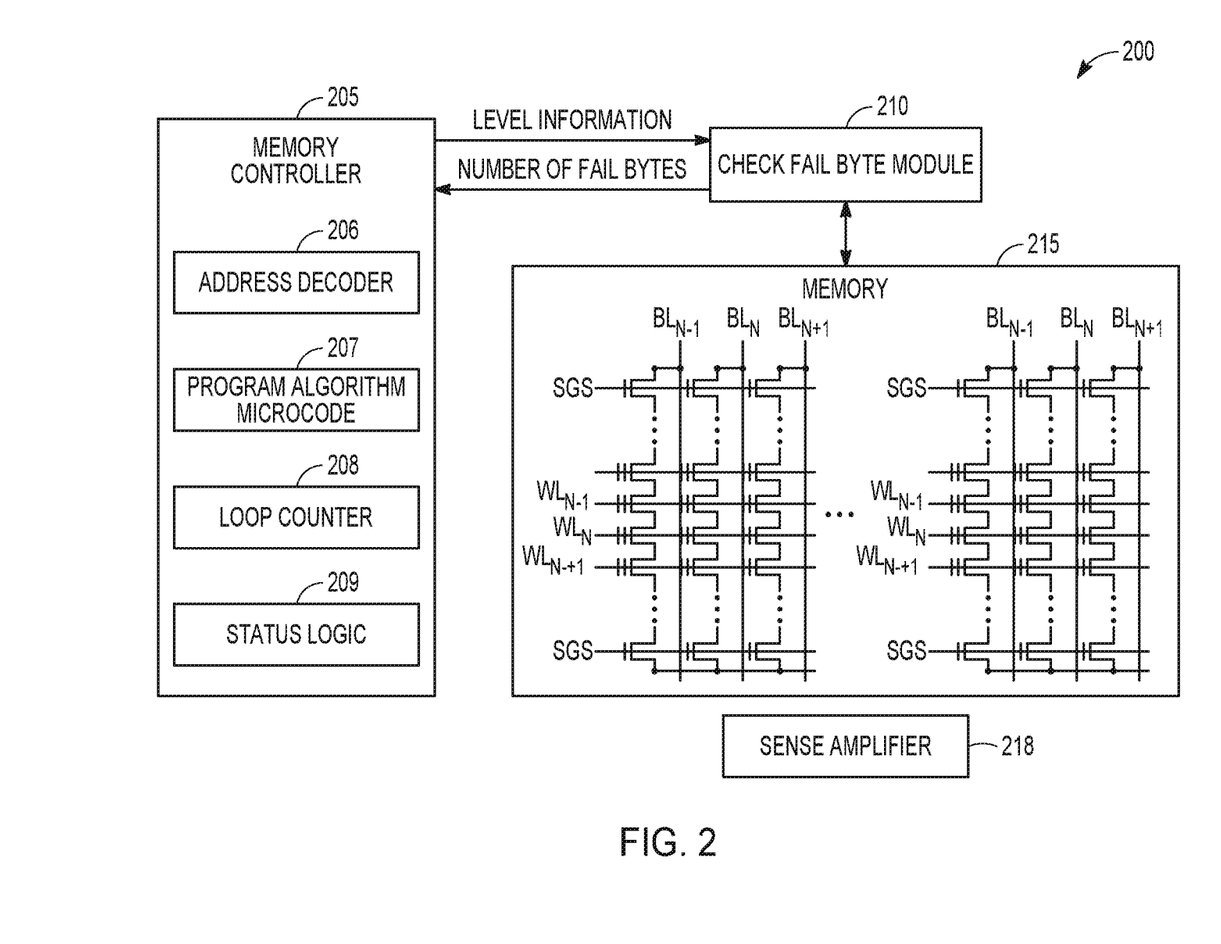
FIG. 2 is a block diagram of an example memory that includes a one check fail byte scheme, according to various embodiments.

FIG. 2 is a block diagram of an embodiment of an example memory 200 that includes a one check fail byte scheme. Memory 200 can include a memory controller 205 that operates with a CFBYTE module 210 in the programming of memory cells in an array of memory cells 215. Memory controller can include an address decoder 206, a program algorithm microcode 207, a loop controller 208, and status logic 209. Address decoder 206 can be arranged to determine the access line and data line location of memory cells of memory array 215 to be programmed. Program algorithm microcode 207 can be implemented to determine memory cells to be programmed or inhibited based on a given target level. A set of memory cells can be programmed in groups of cells according to a target level for the group that corresponds to a specific n-tuple to which the cells of the respective are being programmed. Loop controller 208 provides a counter for program pulse and verify in which a target level is determined based off CBYTE results. Status logic 209 can be arranged to provide pass/fail information.

Memory controller 205 is communicatively coupled to CFBYTE module 210 to provide level information regarding memory cells to be programmed into memory cells of memory array 215. CFBYTE module 210 can provide for Data Program Completion (DPC), also known as Distribution Program Completion, in which DPC CFBYTE counts the number of failed bytes on cells targeted at a specific level in programming the memory cells. Failed cells may be determined by applying a pulse to a selected access line (WL) and reading current in a data line (BL) using a SGD line, a SGS line, and a sense amplifier of a set of sense amplifiers 218. The structure shown in FIG. 2 can be implemented in a NAND architecture, but memories devices using a one check fail byte scheme, as taught herein, are not limited to NAND memories. CFBYTE module 210 returns the number of fail bytes from the determination to memory controller 205, which can include a number of fail bytes at a specific level. The number of fail bytes can be used by one or more components of memory controller 205. If the number of fail bytes is greater than an acceptable number, memory 200 can provide a program fail status to a processor or controller external to memory 200.

Figure 3A:
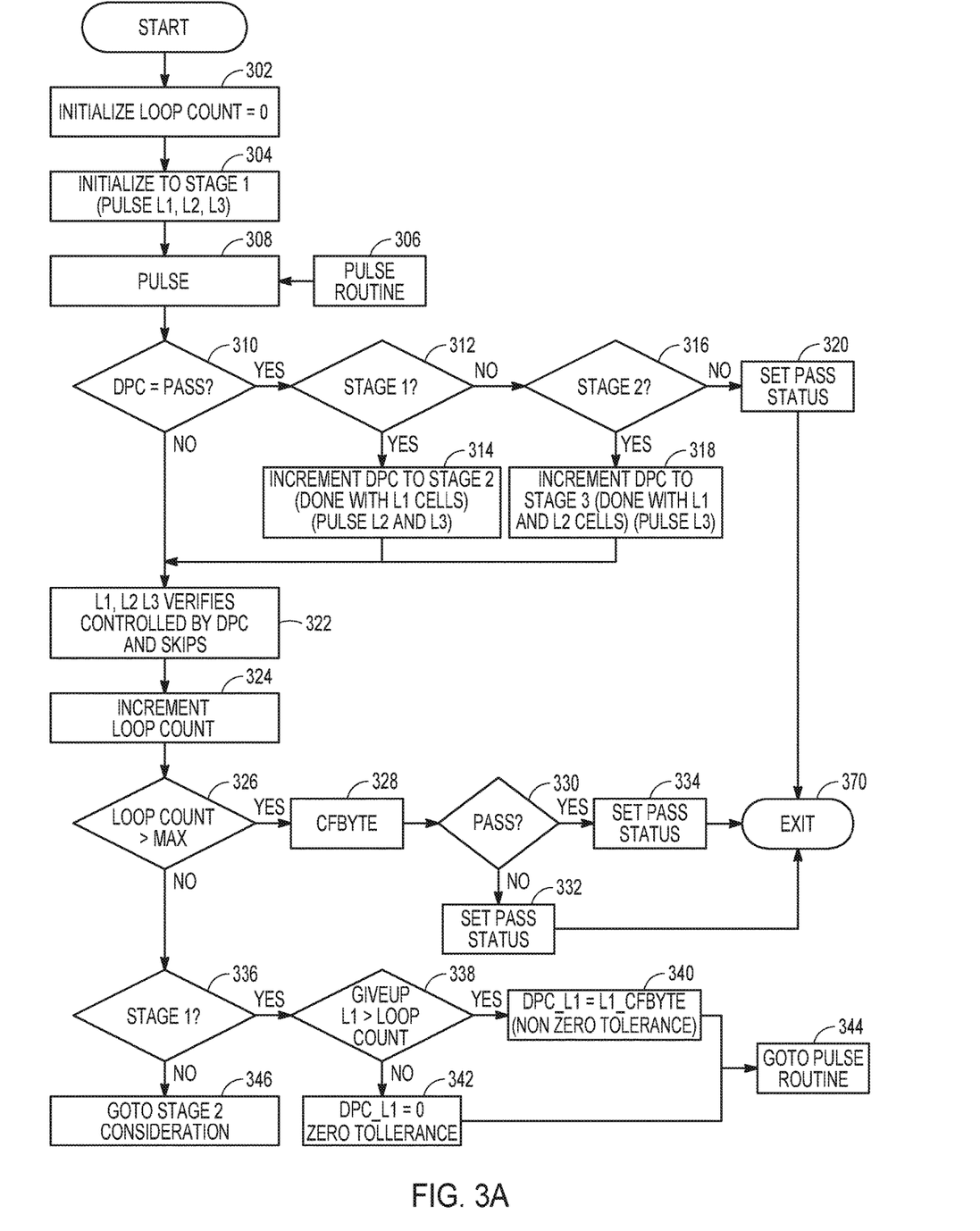
FIGS. 3A and 3B are a flow diagram of an example method of a programming/verify procedure using a one CFBYTE scheme in a memory device, according to various embodiments.
Figure 3B:
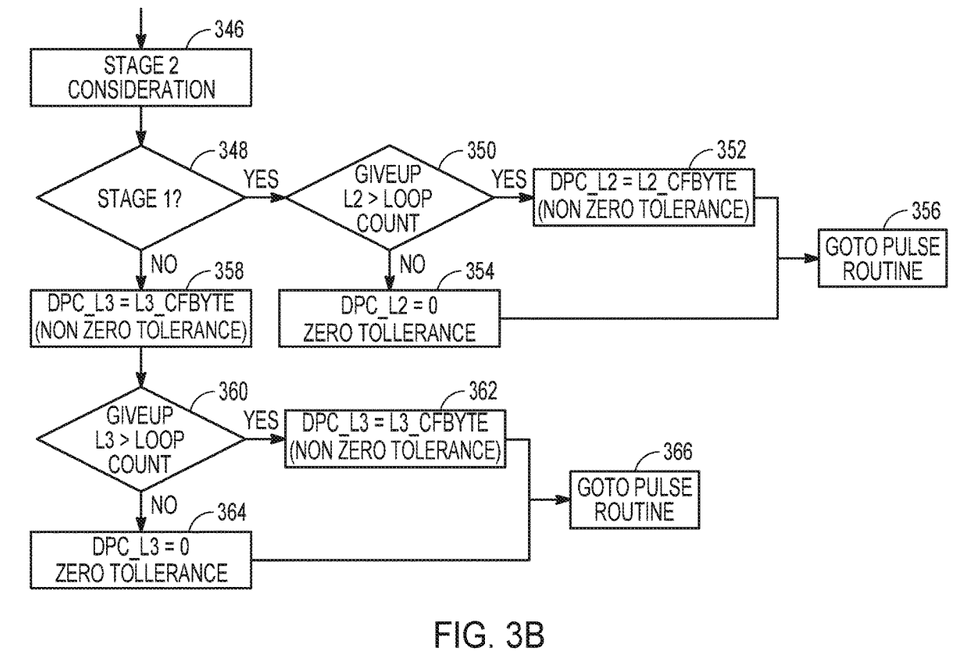

FIGS. 3A and 3B are a flow diagram of an embodiment of an example method 300 of a programming/verify procedure using a one CFBYTE scheme in a memory device. In this example, a memory device having 2-bit memory cells is operated, where with two bits per cell, there are four levels correlated to threshold voltages. These four levels can be referred to as L0, L1, L2, and L3. With L0 as the lowest level, a loop procedure of pulsing and verifying can be applied to levels L1, L2, and L3. At 302, after starting the procedure, a loop count is initialized to zero. At 304, the procedure is initialized to stage 1. This initialization to stage 1 can include applying a pulse L1, L2, and L3 by placing a voltage on the access lines to the group of memory cells to be programmed to each of L1, L2, and L3 levels. With L2 and L3 at higher threshold levels than L1, moving the memory cells to higher threshold levels takes a longer time, and applying the voltage at the initialization at stage 1 reduces time to program at later stages for L2 and L3. At 308, a pulse procedure is applied, which includes applying an appropriate voltage for a given level to a selected set of memory cells corresponding to this level.

At 310, a determination is made as to whether a DPC has been passed. DPC provides a pass/fail criteria for checking program levels, where each level is also referred to as a distribution. DPC may also be referred to as distribution program check. If it is determined at 310 that the DPC is at a pass state, the current stage is checked. At 312, after determining that the DPC is at a pass state, a determination is made as to whether the procedure is at stage 1. If the procedure is at stage 1, it is not at stages 2 and 3. If the determination at 312 is yes with respect to stage 1, at 314, the DPC is incremented to stage 2, since the procedure is completed with respect to L1 memory cells. A voltage is applied to access lines of memory cells at levels L2 and L3 to provide a program pulse. If the determination at 312 is no, a determination, at 316, is made as to whether the procedure is at stage 2. If the determination at 316 is yes with respect to stage 2, the DPC is incremented to stage 3, at 318, since the procedure is completed with respect to L2 memory cells in addition to being completed with respect to with stage L1 memory cells. A voltage is applied to access lines of memory cells at level L3 to provide a program pulse. If the determination at 316 is no, then all levels L1, L2, and L3 have passed with respect to DPC, and at 320, the procedure is set to a pass status such that the procedure can be exited at 370.

If the determination at 310 is no in that the DPC is not at a pass state or the DPC has been incremented to stage 2 at 314 or the DPC has a been incremented to stage 3 at 318, at 322, the verification of the memory cells programmed at levels L1, L2, and L3 are controlled by DPC and skips over memory cells not verified. At 324, the loop count is incremented. At 326, a determination is made as to whether the loop count is greater than a set maximum. If the determination is yes at 326 that the loop count is greater than the set maximum, a final count of fails is made by CFBYTE at 328. At 330, a determination is made as to where the CFBYTE at 328 passes. The CFBYTE passes if the number of fails is less than a preset threshold for the number of allowable fails. If the determination that the CFBYTE passes is a no, then at 332, a fail status is set and the procedure exits at 370. If the determination that the CFBYTE passes is a yes, then at 334, a pass status is set and the procedure exits at 370. Upon exit at 370, a memory controller or other component of the memory device being programmed can generate an appropriate message to an external processing device that the program procedure passed or failed based on the result from 330.

If the determination is no at 326 that the loop count is greater than the set maximum, then the program pulse loop routine can be continued with respect to the respective stage at which the procedure is currently processing. At 336, a determination is made as to whether the procedure is at stage 1. If the determination at 336 is yes that the procedure is at stage 1, a determination is made at 338 as to whether the number of loops for attempting program verification of the bits at L1 at which verification/program is stopped is greater than the current loop count. There is a number of times that a program pulse is tried before the procedure is given up for the memory cells at L1, which is shown as GiveupL1 in FIG. 3A. For the bits at L1 being (01), GiveupL1 can be referred to as Giveup01. If the determination at 338 is no that the GiveupL1 number is not greater than the loop count, DPC for L1 is set to zero for zero tolerance for an all pass condition, and the procedure enters a goto pulse routine state, at 344. If the determination at 338 is yes that the GiveupL1 number is greater than the loop count, DPC for L1 is set to the CFBYTE for L1 for a non-zero tolerance condition, and the procedure enters a goto pulse routine state, at 344. From the goto pulse routine state at 344, the pulse routine for another loop is entered at 306. If the determination at 336 is no that the procedure is not at stage 1, then a stage 2 consideration is entered at 346.

From stage 2 consideration at 346, a determination is made, at 348, as to whether the procedure is at stage 2. If the determination at 348 is yes that the procedure is at stage 2, a determination is made at 350 as to whether the GiveupL2 number is greater than the current loop count. For the bits at L2 being (00), GiveupL2 can be referred to as Giveup00. If the determination at 350 is no that the GiveupL2 number is not greater than the loop count. DPC for L2 is set to zero for zero tolerance condition, and the procedure enters a goto pulse routine state, at 356. From the goto pulse routine state at 356, the pulse routine for another loop is entered at 306. If the determination at 350 is yes that the GiveupL2 number is greater than the loop count, DPC for L2 is set to the CFBYTE for L2 for a non-zero tolerance condition, and the procedure enters a goto pulse routine state, at 356. From the goto pulse routine state at 356, the pulse routine for another loop is entered at 306.

From the determination at 348 that the procedure is not in stage 2 but in stage 3, the DPC for L3 is set to the CFBYTE for L3, at 358. From 358 in the procedure, a determination is made at 360 as to whether the GiveupL3 number is greater than the current loop count. For the bits at L3 being (10), GiveupL3 can be referred to as Giveup10. If the determination at 360 is no that the GiveupL3 number is not greater than the loop count, DPC for L3 is set to zero for zero tolerance condition, and the procedure enters a goto pulse routine state, at 366. If the determination at 360 is yes that the GiveupL3 number is greater than the loop count, DPC for L3 is set to the CFBYTE for L3 for a non-zero tolerance condition, and the procedure enters a goto pulse routine state, at 366. From the goto pulse routine state at 366, the pulse routine for another loop is entered at 306.

Method 300, discussed above, provides an example of a one CFBYTE scheme applied to a memory device having memory cells, where each memory cell can store two bits such that each memory cell corresponds to one of four different n-tuples. Method 300 includes three stages: stage 1, stage 2, and stage 3. In stage 1, memory cells being programmed that correspond to distributions L1, L2, and L3 are pulsed. In stage 2, memory cells corresponding to L1 are programmed, and memory cells corresponding to L2 and L3 are pulsed. In stage 3, memory cells corresponding to L are programmed, memory cells corresponding to L2 are programmed, and memory cells corresponding L3 are pulsed. In some cases, DPC can be run during a seed process. In stage 3, DPC for L3 equals the full CFBYTE criterion, since only memory cells corresponding to L3 are left to program for the two-bit example. In a two bit example, L3 will incur full CFBYTE. This includes the accumulation of fail bytes from previous levels. The procedure of method 300 provides a simplification that helps in validation. For memory devices having memory cells storing multiple bits, a procedure similar to method 300 can be executed.

Figure 4:
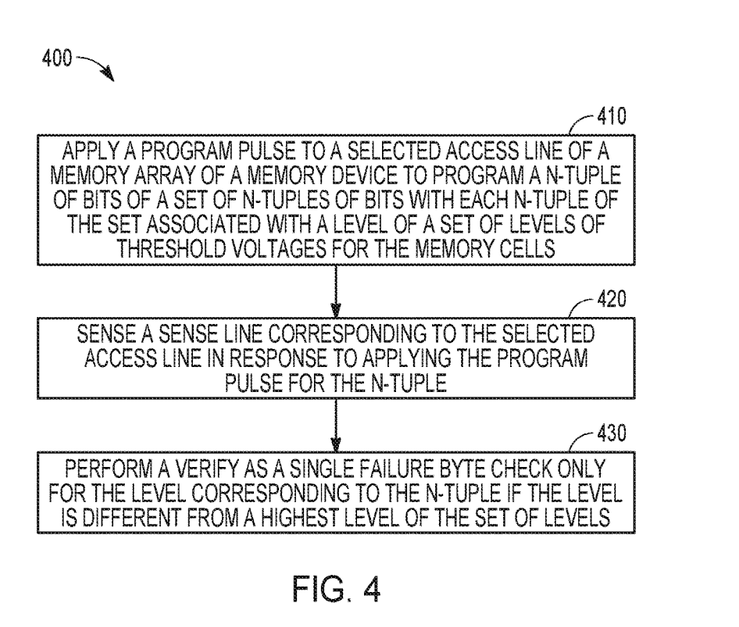
FIG. 4 is a flow diagram of features of an example method associated with programming multiple bits of data in a memory cell of a memory device, according to various embodiments.

FIG. 4 is a flow diagram of features of an embodiment of an example method 400 associated with programming multiple bits of data in a memory cell of a memory device. At 410, a program pulse is applied to a selected access line of a memory array of the memory device to program a n-tuple of bits of a set of n-tuples of bits with each n-tuple of the set associated with a level of a set of levels of threshold voltages for the memory cells. The level of the n-tuple is different from the levels for the other n-tuples of the set of n-tuples. At 420, a sense line corresponding to the selected access line is sensed in response to applying the program pulse for the n-tuple. At 430, a verify is performed as a single failure byte check only for the level corresponding to the n-tuple if the level is different from a highest level of the set of levels. Applying program pulses to each memory cell corresponding to the highest level can be followed by failure byte checks for all levels of the set of levels.

Variations of method 400 or methods similar to method 400 can include a number of different embodiments that may or may not be combined depending on the application of such methods and/or the architecture of systems in which such methods are implemented. Such methods can include applying program pulses to each n-tuple of the set of n-tuples to different selected memory cells, where the different selected memory cells are grouped by correspondence to a level of the set of levels. The different selected memory cells can be programmed in order of level from a lowest level to the highest level. For a failure byte check indicating a programming failure at a level being programmed, such methods can include generating a number of program pulses and corresponding verifies in a loop until programming at the level, indicated to have previously failed, passes its corresponding verify or the loop reaches a limit. Such methods can include generating a fail status from the memory device when the number of program pulses reaches the limit without passing a verify.

A non-transitory machine-readable medium, such as firmware, within a memory device can comprise instructions, such as a microcode, which when executed by a controller in the memory device, can cause the memory device to perform operations comprising: applying a program pulse to a selected access line of a memory array of the memory device to program a n-tuple of bits of a set of n-tuples of bits with each n-tuple of the set associated with a level of a set of levels of threshold voltages for the memory cells, the level different from the levels for the other n-tuples of the set of n-tuples; sensing a sense line corresponding to the selected access line in response to applying the program pulse for the n-tuple; and performing a verify as a single failure byte check only for the level corresponding to the n-tuple if the level is different from a highest level of the set of levels. The microcode instructions can include applying program pulses to each n-tuple of the set of n-tuples to different selected memory cells, where the different selected memory cells are grouped by correspondence to a level of the set of levels. The different selected memory cells can be programmed in order of level from a lowest level to the highest level. Applying program pulses to each memory cell corresponding to the highest level can be followed by failure byte checks for all levels of the set of levels. For a failure byte check indicating a programming failure at a level being programmed, a number of program pulses and corresponding verifies in a loop can be generated until programming at the level, indicated to have previously failed, passes its corresponding verify or the loop reaches a limit. A fail status can be generated from the memory device when the number of program pulses reaches the limit without passing a verify.

In various embodiments, an apparatus can comprise: an array of memory cells and a controller operable to program each memory cell as a n-tuple of bits of a set of n-tuples of bits with each n-tuple associated with a level of a set of levels of threshold voltages for the memory cells, where the level is different from the levels for the other n-tuples of the set of n-tuples. The programming can be conducted on sets of memory cells, with each set corresponding to a different level, by placing the threshold voltage to a value corresponding to the n-tuple for which the memory cells of the respective set of memory cells are being programmed, one level at a time. The controller can be operable to perform a verify as a single failure byte check for the one level only, for each level except a last level. The set of n-tuples can be an ordered set of n-tuples in which a lowest level is associated with a lowest value for the threshold voltage and the last level is associated with a highest value for the threshold voltage. The controller can be arranged to perform a failure byte check for all levels in response to programming at the last level. For the failure byte check indicating a programming failure at a level being programmed, the controller can be arranged to generate a number of program pulses and corresponding verifies in a loop until programming at the level passes its corresponding verify or the loop reaches a limit. The controller can be arranged to generate a fail status when a number of programming pulses reaches the limit and to exit programming and verifying of the memory cells at the level being programmed.

In various embodiments, a memory device can comprise: an array of memory cells, sense lines coupled to the memory cells of the array, access lines coupled to the memory cells of the array, a controller, and a counter. The controller can be operable to program each memory cell as a n-tuple of bits of a set of n-tuples of bits with each n-tuple associated with a level of a set of levels of threshold voltages for the memory cells, the level different from the levels for the other n-tuples of the set of n-tuples. The programming can be conducted on sets of memory cells, with each set corresponding to a different level, by placing the threshold voltage to a value corresponding to the n-tuple for which the memory cells of the respective set of memory cells are being programmed, one level at a time. The controller can be configured to be operable to perform a verify as a single failure byte check for the one level only, for each level except a last level. The counter can be arranged to count a number of program pulses generated in a loop until programming at a level passes a corresponding verify. The controller can be operable to program different selected memory cells to different levels, where the different selected memory cells can be grouped by correspondence to a level of the set of levels. The controller can be operable to program the different selected memory cells in order of level from a lowest level to a highest level. The controller can be arranged to be operable to apply program pulses to each memory cell corresponding to a highest level of the set, followed by application of failure byte checks for all levels of the set of levels.

In various embodiments, a system can comprise: a processor and a memory device coupled to the processor. The memory device can have an array of memory cells and a controller operable to program a set of the memory cells in response to a program command received from the processor. The controller can be operable to program each memory cell as a n-tuple of bits of a set of n-tuples of bits with each n-tuple of the set associated with a level of a set of levels of threshold voltages for the memory cells. The level of the n-tuple is different from the levels for the other n-tuples of the set of n-tuples. The programming can be conducted on sets of memory cells, with each set corresponding to a different level, by placing the threshold voltage to a value corresponding to the n-tuple for which the memory cells of the respective set of memory cells are being programmed, one level at a time. The controller can be operable to perform a verify as a single failure byte check for the one level only, for each level except a last level.

The controller can be arranged to perform a failure byte check for all levels in response to programming at the last level. For the failure byte check indicating a programming failure at a level being programmed, the controller can be arranged to generate a number of program pulses and corresponding verifies in a loop until programming at the level passes its corresponding verify or the loop reaches a limit. The controller can be arranged to generate a fail status to the processor when a number of programming pulses reaches the limit. The array of memory cells can be arranged as a set of blocks with pages within each block, and the controller can be arranged to program the set of memory cells one page at a time.

Figure 5:
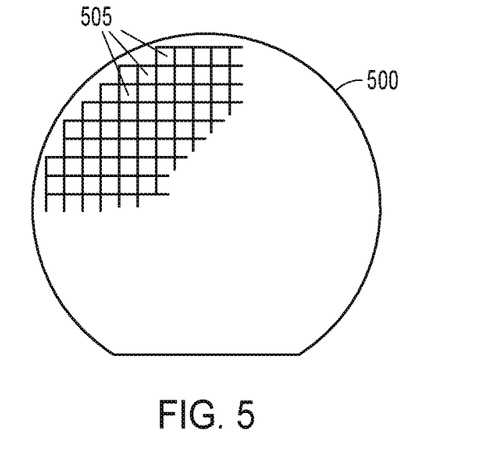
FIG. 5 illustrates an example of a wafer having dice including memory device arranged to conduct a one check fail byte scheme, according to various embodiments.

FIG. 5 illustrates an embodiment of an example of a wafer 500 arranged to provide multiple electronic components. Wafer 500 can be provided as a wafer in which a number of dice 505 can be fabricated. Alternatively, wafer 500 can be provided as a wafer in which the number of dice 505 have been processed to provide electronic functionality and are awaiting singulation from wafer 500 for packaging. Wafer 500 can be provided as a semiconductor wafer, a semiconductor on insulator wafer, or other appropriate wafer for processing electronic devices such as an integrated circuit chips.

Using various masking and processing techniques, each die 505 can be processed to include functional circuitry such that each die 505 is fabricated as an integrated circuit with the same functionality and packaged structure as the other dice on wafer 500. Alternatively, using various masking and processing techniques, various sets of dice 505 can be processed to include functional circuitry such that not all of the dice 505 are fabricated as an integrated circuit with the same functionality and packaged structure as the other dice on wafer 500. A packaged die having circuits integrated thereon providing electronic capabilities is herein referred to as an integrated circuit (IC).

Wafer 500 can comprise multiple dice 505. Each die 505 of the multiple dice can be structured as a memory device having a controller and firmware to implement a one CFBYTE scheme, as taught herein. The memory device may be structured with functionality similar or identical to memory devices associated with FIGS. 1-4.

Figure 6:
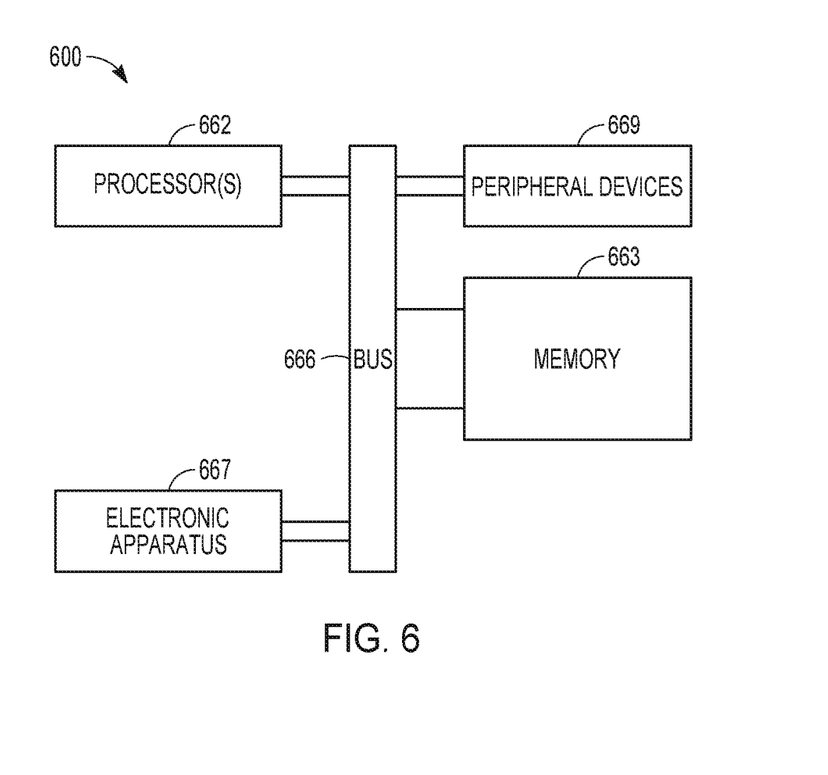
FIG. 6 is a block diagram of an example system that includes a memory device having a controller and firmware to implement a one check fail byte scheme, according to various embodiments

FIG. 6 is a block diagram of an embodiment of an example system 600 that includes a memory device 663 having a controller and firmware to implement a one CFBYTE scheme, as taught herein. System 600 can include a processor 662 operatively coupled to memory 663. System 600 can also include an electronic apparatus 667 and peripheral devices 669. One or more of processor 662, memory 663, electronic apparatus 667, or peripheral devices 669 can be in the form of one or more ICs.

A bus 666 can provide electrical conductivity between and/or among various components of system 600. In an embodiment, bus 666 can include an address bus, a data bus, and a control bus, each independently configured. In an alternative embodiment, bus 666 can use common conductive lines for providing one or more of address, data, or control, the use of which is regulated by processor 662. Processor 662 can be in the form or one or more processors.

Electronic apparatus 667 may include additional memory. Memory in system 600 may be constructed as one or more types of memory such as, but not limited to, dynamic random access memory (DRAM), static random access memory (SRAM), synchronous dynamic random access memory (SDRAM), synchronous graphics random access memory (SGRAM), double data rate dynamic ram (DDR), double data rate SDRAM, and magnetic based memory.

Peripheral devices 669 may include displays, imaging devices, printing devices, wireless devices, additional storage memory, and control devices that may operate in conjunction with processor 662. In various embodiments, system 600 includes, but is not limited to, fiber optic systems or devices, electro-optic systems or devices, optical systems or devices, imaging systems or devices, and information handling systems or devices such as wireless systems or devices, telecommunication systems or devices, and computers.

Although specific embodiments have been illustrated and described herein, it will be appreciated by those of ordinary skill in the art that other arrangements derived from the teachings herein may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description. Combinations of the above embodiments and other embodiments will be apparent to those of skill in the art upon studying the above description.

What is claimed is:

1. A memory system, comprising:
an array of memory cells, the memory cells being multiple-bit memory cells; and
a controller operable to:
program selected memory cells at multiple voltage levels from a lowest voltage level to a highest voltage level;
after programming the selected memory cells at each voltage level other than the highest voltage level, perform failure byte checks of cells programmed at the respective programmed voltage level until such cells satisfy a byte failure criterion at such respective programmed voltage level;
upon determining that the byte failure criterion is satisfied at such respective programmed voltage level, program a next set of the selected memory cells at next higher voltage level; and
perform a failure byte check for all programmed voltage levels after programming the selected memory cells at the highest voltage level.

2. The memory system of claim 1, wherein the multiple-bit memory cells are N-bit memory cells with N being an integer equal to or greater than two and the multiple voltage levels are equal to $2^N$ in number.

3. The memory system of claim 1, wherein the lowest voltage level is associated with a lowest value for a threshold voltage and the highest voltage level is associated with a highest value for a threshold voltage.

4. The memory system of claim 1, wherein the controller is arranged to perform the failure byte check to begin at a first voltage level above a zeroth voltage level.

5. The memory system of claim 1, wherein for a failure at a specific respective programmed voltage level, the controller is arranged to generate a number of program pulses and corresponding verifies in a number of loops until programming at the specific respective programmed voltage level passes its corresponding verify or the number of loops reaches a limit without verification.

6. The memory system of claim 5, wherein the controller is arranged to generate a fail status when a number of programming pulses reaches the limit without verification and exit programming and verifying of the memory cells at the specific respective programmed voltage level.

7. The memory system of claim 1, wherein the controller includes microcode to determine memory cells of the array to be programmed or inhibited based on a given target programmed voltage level.

8. The memory system of claim 1, wherein the multiple-bit memory cells are 2-bit memory cells.

9. A system comprising:
an array of memory cells, the memory cells being N-bit memory cells with N being an integer equal to or greater than two;
a controller to execute instructions to:
program selected memory cells at multiple voltage levels from a lowest voltage level to a highest voltage level;
after programming the selected memory cells at each voltage level other than the highest voltage level, perform failure byte checks of cells programmed at the respective programmed voltage level until such cells satisfy a byte failure criterion at such respective programmed voltage level;
upon determining that the byte failure criterion is satisfied at such respective programmed voltage level, program a next set of the selected memory cells at next higher voltage level; and
perform a failure byte check for all programmed voltage levels after programming the selected memory cells at the highest voltage level; and
a loop counter to count a number of loops in which program pulses with corresponding verifies are executed with respect to reaching a status corresponding to the respective programmed voltage level.

10. The system of claim 9, wherein the controller is arranged to allow failure to program a number of memory cells corresponding to a given voltage level of the multiple voltage levels in response to a determination whether a total number of failing memory cells for the given voltage level is below a check fail byte criterion for the given voltage level.

11. The system of claim 9, wherein the loop counter includes a limit to the number of loops in which program pulses and corresponding verifies are executed with respect to reaching the status corresponding to the respective programmed voltage level.

12. The system of claim 11, wherein the controller is arranged to generate a fail status to a processor, external to the array and the controller, when a number of programming pulses reaches the limit without verification.

13. The system of claim 9, wherein the operations to perform failure byte checks of cells programmed at the respective programmed voltage level until such cells satisfy the byte failure criterion at such respective programmed voltage level include generation of program pulses and corresponding verifies in a number of loops until programming at the respective programmed voltage level passes its corresponding verify or the number of loops reaches a limit without verification.

14. A method comprising:
 programming memory cells of an array of memory cells at multiple voltage levels from a lowest voltage level to a highest voltage level;
 after programming the memory cells at each voltage level other than the highest voltage level, performing failure byte checks of cells programmed at the respective programmed voltage level until such cells satisfy a byte failure criterion at such respective programmed voltage level;
 upon determining that the byte failure criterion is satisfied at such respective programmed voltage level, programming a next set of the memory cells at next higher voltage level; and
 performing a failure byte check for all programmed voltage levels after programming the selected memory cells at the highest voltage level.

15. The method of claim 14, wherein programming the memory cells includes applying program pulses to program first memory cells of the memory cells associated with a lowest value for a threshold voltage and second memory cells of the memory cells with a highest value for a threshold voltage.

16. The method of claim 14, wherein the method includes, for a failure byte check indicating a programming failure at a respective programmed voltage level, generating a program pulse and corresponding verify in a number of loops until programming at the respective programmed voltage level, indicated to have previously failed, passes its corresponding verify or the number of loops reaches a limit without verification.

17. The method of claim 16, wherein the method includes generating a fail status, from a memory device in which the array of memory cells is disposed, when the number of program pulses reaches the limit without verification.

18. The method of claim 16, wherein the method includes stepping up program pulse voltages in subsequent loops of the number of loops.

19. The method of claim 14, wherein the method includes, for programmed memory cells reaching a respective target voltage level determined during a verification pulse, inhibiting the programmed memory cells from being pulsed in all subsequent program pulses in the programming of the memory cells of the array after the programmed memory cells have reached the respective target voltage level.

20. The method of claim 14, wherein the method includes allowing failure to program a number of memory cells in response to determining whether a total number of failing memory cells for a respective programmed voltage level is below a criterion for the respective programmed voltage level.

* * * * *